United States Patent [19]
Omura

[11] Patent Number: 6,081,382
[45] Date of Patent: Jun. 27, 2000

[54] CATADIOPTRIC REDUCTION PROJECTION OPTICAL SYSTEM

[75] Inventor: Yasuhiro Omura, Tokyo, Japan

[73] Assignee: Nikon Corporation, Tokyo, Japan

[21] Appl. No.: 09/305,540

[22] Filed: May 5, 1999

[30] Foreign Application Priority Data

May 7, 1998 [JP] Japan .................................. 10-140623

[51] Int. Cl.[7] ............................ G02B 27/14; G02B 17/00
[52] U.S. Cl. ........................................... 359/629; 359/727
[58] Field of Search .................................. 359/618, 629, 359/727

[56] References Cited

U.S. PATENT DOCUMENTS

| | | | |
|---|---|---|---|
| 5,668,672 | 9/1997 | Oomura | 359/727 |
| 5,694,241 | 12/1997 | Ishiyama et al. | 359/364 |
| 5,742,436 | 4/1998 | Furter | 359/727 |

*Primary Examiner*—Ricky Mack
*Attorney, Agent, or Firm*—Oliff & Berridge, PLC

[57] ABSTRACT

A catadioptric reduction projection optical system (10, 30) capable of forming a reduced image of a pattern of a reticle (R) on a wafer (W) by scanning the reticle and wafer in a scanning direction (12, 14). The system comprises, in order from a first surface (OP) to a second surface (IP) along a folded optical axis (A), a first optical system (G1) having positive refracting power, and a beam splitter (BS) having a transmissoreflective surface and a reflection optical path and a transmission optical path. The beam splitter is arranged such that the plane of incidence, defined by the folded optical axis, includes the scanning direction. The system also includes a second optical system (G2) comprising a single concave mirror ($M_C$) arranged in one of the reflection optical path and transmission optical path, and a third optical system. The latter has negative refracting power and includes a reflective plane surface ($M_P$). The third optical system arranged in the opposite one of the reflection optical path and the transmission optical path as the second optical system. The system also includes a fourth optical system having positive refracting power. The system also preferably satisfies a number of design conditions.

18 Claims, 5 Drawing Sheets

CATADIOPTRIC REDUCTION PROJECTION OPTICAL SYSTEM

FIELD OF THE INVENTION

The present invention pertains to a projection optical system for use in an exposure apparatus for fabricating semiconductor devices, liquid crystal display devices, or the like, and in particular pertains to such systems for use in a scanning-type exposure apparatus.

BACKGROUND OF THE INVENTION

In photolithographic processes for fabricating semiconductor devices and the like, an exposure apparatus is employed to project, by way of a projection optical system, the image of a pattern on a photomask or reticle (collectively referred to hereinafter as a "reticle") onto a wafer, glass plate, or the like (collectively referred to hereinafter as a "wafer") which has been coated with photosensitive layer such as photoresist ("resist"). Semiconductor devices and the like have grown increasingly large in size and have been integrated to increasingly high densities in recent years. Accordingly, scanning-type exposure apparatus are being developed to handle the increased size of semiconductor devices.

As semiconductor devices are integrated to higher densities, increased resolving power is being demanded of projection optical systems. To satisfy this demand, it has become necessary to shorten the illumination wavelength and to increase the numerical aperture (NA) of the projection optical system.

However, shortening the illumination wavelength results in there being only a limited number of glass types available in practice due to absorption of light. Presently, the only glass types capable of being put to practical use at wavelengths of 300 nm and lower are synthetic quartz and fluorite. However, the Abbe numbers of these two materials are not sufficiently different to adequately correct chromatic aberration.

Because of the extremely high optical performance demanded, correction of the various aberrations must be such that practically no aberration remains. To accomplish this with a refractive projection optical system consisting only of lens groups (i.e., a dioptric system), many lens elements are required. Such optical systems have poor transmittance, and the need for many lens elements increases the cost of manufacturing such an optical system.

In contrast, all-reflective (i.e., catoptric) optical systems employing reflective surfaces such as concave mirrors and the like do not display chromatic aberration. Moreover, because the contribution to the Petzval sum of a mirror is opposite that of a lens, so-called catadioptric optical systems (i.e., systems which combine reflective and refractive elements) make it possible to practically eliminate not only chromatic aberration but also the other types of aberration as well, without increasing the number of lenses.

There have been a variety of proposals within the art for a catadioptric projection optical systems. For example, Japanese Examined Patent Application (Kokoku) No. H7[1995]-117648, Japanese Laid-Open Patent Application (Kokai) No. H6[1994]-300973, Japanese Laid-Open Patent Application (Kokai) No. H5[1993]-88089, Japanese Laid-Open Patent Application (Kokai) No. H3[1991]-282527, PCT/EP95/01719, and others disclose catadioptric reduction projection optical systems having an optical-path-changing beam splitter for inputting and outputting a light beam to and from a reflecting system.

In the aforementioned prior art, it is necessary to employ a beam splitter having a transmissoreflective (i.e., partially transmitting, partially reflecting) surface for splitting the optical path. It is necessary that this beam splitter be in the shape of a prism to prevent occurrence of asymmetrical aberrations. Moreover, with the aforementioned prior art, increasing the numerical aperture (NA) at the image side to increase resolving power requires a large prism that is 200 mm or longer on one side. Manufacture such a large prism is extremely difficult. In particular, nonuniformity and distortion (or strain) in the interior diminishes resolving power.

Japanese Laid-Open Patent Application (Kokai) No. H3[1991]-282527 and the other references cited above, may utilize a polarizing beam splitter. Such beam splitters require a multilayer transmissoreflective film on the transmissoreflective surface. The film is such that incident light is transmitted if it is P-polarized and reflected if it is S-polarized. This prevents the occurrence of luminous energy losses and stray light such as that due to flare or the like. A quarter-wave plate for changing polarization state is also necessary. However, as the polarizing beam splitter, quarter-wave plate, or other such optical element increases in size, its manufacture becomes extremely difficult. Also, the cost to manufacture such components is extremely high.

SUMMARY OF THE INVENTION

The present invention pertains to a projection optical system for use in an exposure apparatus for fabricating semiconductor devices, liquid crystal display devices, or the like, and in particular pertains to such systems for use in a scanning-type exposure apparatus.

The present invention has the goal of providing a catadioptric reduction projection optical system capable of use in a scanning-type exposure apparatus, having a large numerical apertures at ultraviolet wavelengths, the system includes a concave mirror and prismatic beam splitter sized to be of practical use, and has an adequate image-side working distance and a resolution on the order of a quarter micron.

Accordingly, a first aspect of the invention is a catadioptric reduction projection optical system capable of forming a reduced image of a pattern of a first surface on a second surface by scanning the first and second surfaces in a scanning direction. The system comprises, in order from the first surface to the second surface along a folded optical axis defining a plane of incidence, a first optical system having positive refracting power and a beam splitter having a transmissoreflective surface. The latter includes a reflection optical path and a transmission optical path. The beam splitter arranged such that the plane of incidence includes the scanning direction. The system further includes a second optical system comprising a single concave mirror and arranged in one of the reflection optical path and transmission optical path, and a third optical system having negative refracting power. The third optical system includes a reflective plane surface, and is arranged in the opposite one of the reflection optical path and the transmission optical path of the second optical system. In other words, if the second optical system is arranged in the reflective optical path, the third optical system is arranged in the transmissive optical path, and vice versa. The system also includes a fourth optical system having positive refracting power.

A second aspect of the invention is the catadioptric reduction projection optical system as described above, further comprising an aperture stop within the fourth optical system, and wherein the catadioptric reduction optical system is first-surface-side telecentric and second-surface-side telecentric.

A fourth aspect of the invention is a catadioptric reduction optical system as described above, wherein $X_1$ is a distance along the optical axis from the first surface to the concave mirror, $X_2$ is a distance along the optical axis from the concave mirror to the second surface, and wherein the following condition is satisfied:

$$0.2 < X_1/X_2 < 1.3. \tag{1}$$

A fifth aspect of the invention is the catadioptric reduction projection optical system as described above, wherein $S_3$ is a maximum effective area at the third optical system of marginal luminous flux emerging from an object point on the optical axis at the first surface, $S_4$ is a maximum effective area at the fourth optical system of marginal luminous flux emerging from an object point on the optical axis at the first surface, and wherein the following condition is satisfied:

$$0.1 < S_3/S_4 < 0.8. \tag{2}$$

A sixth aspect of the invention is the catadioptric reduction projection optical system as described above, wherein $\beta$ is an overall transverse magnification, $\beta_1$ is a transverse magnification of the first optical system, $f_1$ is a focal length of the first optical system, and $f_2$ is a focal length of the second optical system. Also, the second optical system comprises at least one negative lens. The system also satisfies the following conditions:

$$|\beta/\beta_1| < 0.1 \tag{3}$$

$$|f_1/f_2| < 1.5. \tag{4}$$

DETAILED DESCRIPTION OF THE INVENTION

The present invention pertains to a projection optical system for use in an exposure apparatus for fabricating semiconductor devices, liquid crystal display devices, or the like, and in particular pertains to such systems for use in a scanning-type exposure apparatus.

Figure 1:
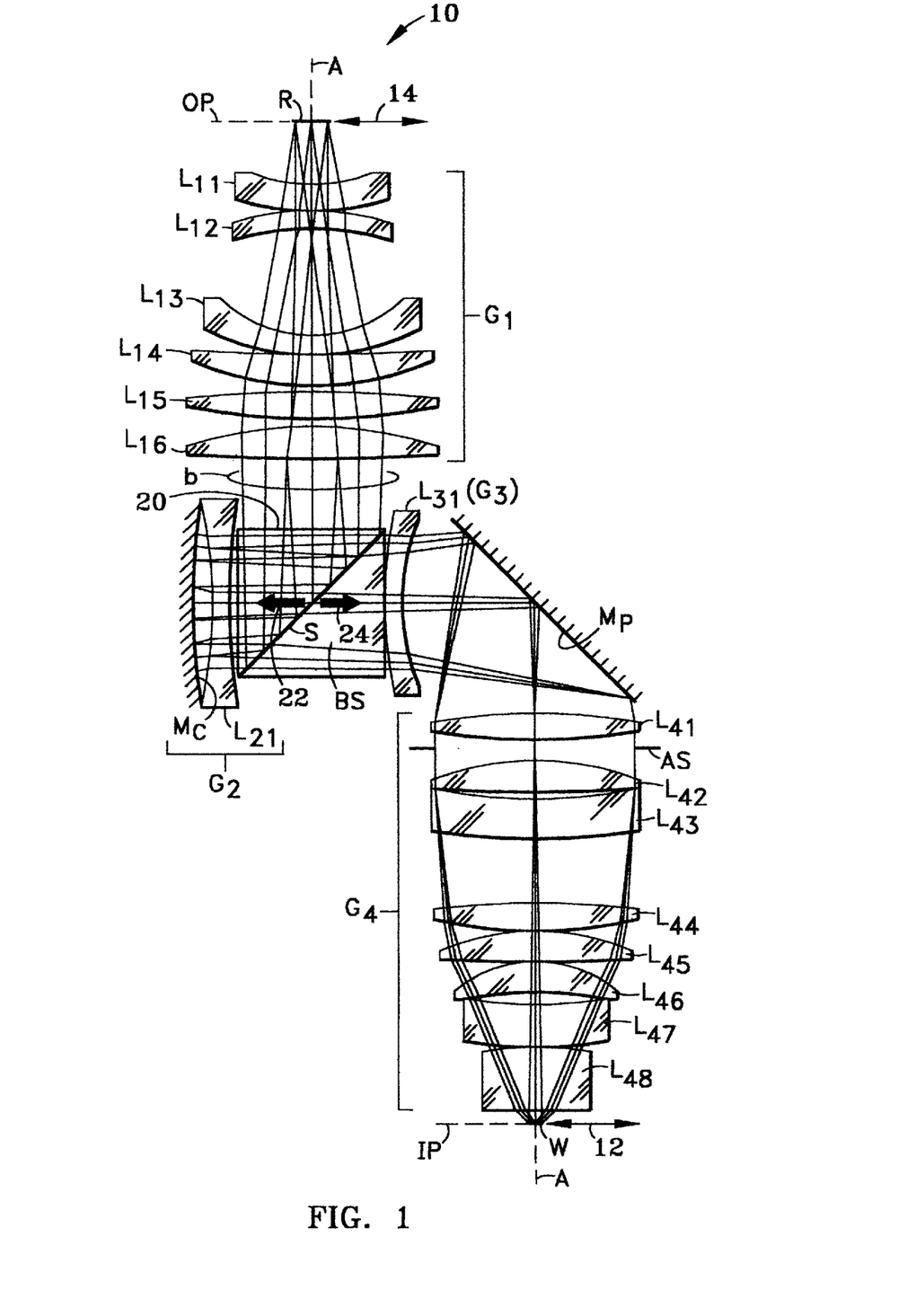
FIG. 1 is a cross-sectional schematic optical diagram of a first embodiment of the catadioptric reduction optical system according to the present invention.
Figure 3:
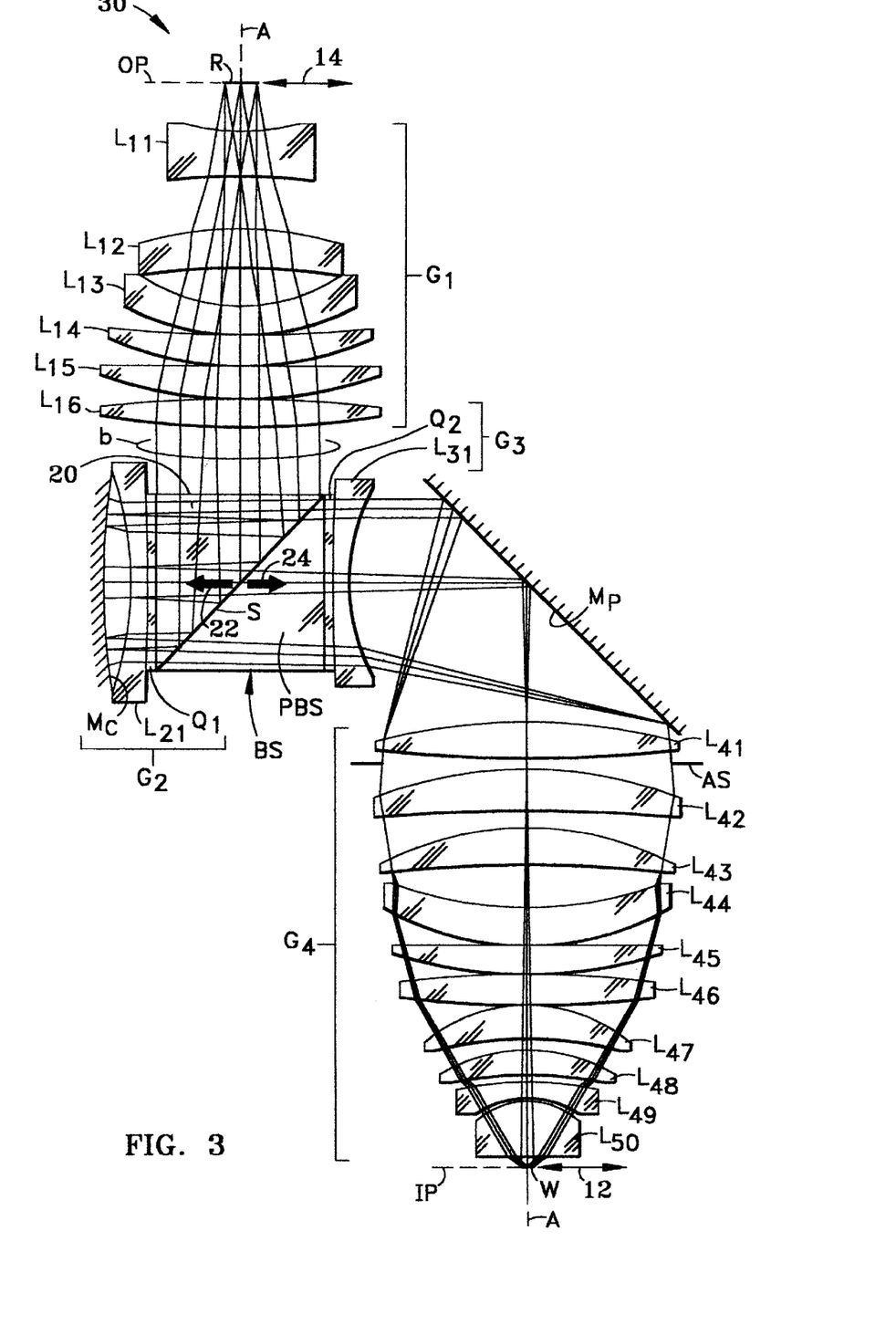
FIG. 3 is a cross-sectional schematic optical diagram of a second embodiment of the catadioptric reduction optical system according to the present invention.

FIGS. 1 and 3 respectively show catadioptric reduction projection optical systems 10 and 30 representing first and second embodiments of the present invention. In systems 10 and 30, a reduced image of a portion of a pattern (not shown) on a reticle R is formed on a wafer W. Reticle R and wafer W are synchronously scanned at speeds in a ratio corresponding to the reduction factor β of the system. As a result, the range of the image of the pattern formed on the wafer W is extended in the scan direction, indicated by the double-ended arrow 12. Note that in FIGS. 1 and 3, the scan direction of reticle R and wafer W is in the plane of the paper, as indicated by the double-ended arrows 14 and 12, respectively.

Both catadioptric reduction projection optical systems 10 and 30 comprise, along an optical axis A and in order from an object plane OP (i.e., a first surface) within which is arranged reticle R, to an image plane IP (i.e., a second surface) within which is arranged wafer W, a first optical system $G_1$ having positive refracting power, and a beam splitter BS. The latter has an incident surface 20 and a transmissoreflective surface S. Beam splitter BS is arranged such that the plane of incidence (defined as the plane containing incident and reflected (i.e., folded) optical axis A) contains scan directions 12 and 14. Beam splitter BS also has a reflection optical path 22 and a transmission optical path 24 associated with a light beam b. Systems 10 and 30 further include a second optical system $G_2$ comprising a single concave mirror $M_C$ arranged in reflection optical path 22. Also included in systems 10 and 30 is a third optical system $G_3$ having negative refracting power and arranged in transmission optical path 24 which returns and passes through beam splitter BS from second optical system $G_2$. Systems 10 and 30 also include a reflective plane surface $M_P$, and a fourth optical system $G_4$ having positive refracting power.

In both systems 10 and 30, reflective plane surface $M_P$ comprises a plane mirror. Also, an aperture stop AS is arranged within fourth optical system $G_4$.

With continuing reference to FIG. 1 and system 10, the operation of the catadioptric reduction projection optical system of the present invention is now described. Light beam b, initially incident beam splitter BS at incident surface 20, is first reflected by transmissoreflective surface S along reflection optical path 22 and is subsequently transmitted through the transmissoreflective surface along transmission optical path 24. However, it is also possible to employ a configuration wherein light beam b is first transmitted through transmissoreflective surface S and is subsequently reflected by transmissoreflective surface S, in which case concave mirror $M_C$ should be arranged adjacent beam splitter BS opposite incident surface 20.

With continuing reference to FIG. 1 and system 10, first optical system $G_1$ comprises a meniscus lens $L_{11}$ which presents a concave surface toward reticle R, a meniscus lens $L_{12}$ which presents a concave surface toward wafer W, a negative meniscus lens $L_{13}$ which presents a concave surface toward reticle R, and three positive lenses $L_{14}$, $L_{15}$, $L_{16}$. Second optical system $G_2$ comprises a biconcave lens $L_{21}$ and a concave mirror $M_C$, with the curvature of biconcave lens $L_{21}$ being stronger on the side toward concave mirror $M_C$. Third optical system $G_3$ comprises a negative meniscus lens $L_{31}$ which presents a concave surface toward wafer W. Fourth optical system $G_4$ comprises two positive lenses $L_{41}$, $L_{42}$, a meniscus lens $L_{43}$ which presents a concave surface toward reticle R, three positive lenses $L_{44}$, $L_{45}$, $L_{46}$, a meniscus lens $L_{47}$ which presents a concave surface toward reticle R, and a positive lens $L_{48}$. Of these, lenses $L_{42}$ and $L_{46}$ are formed from fluorite ($CaF_2$), while the other lenses and beam splitter BS are formed from quartz glass ($SiO_2$).

With reference now to FIG. 3 and system 30, first optical system $G_1$ comprises a biconcave lens $L_{11}$, a meniscus lens $L_{12}$ which presents a concave surface toward the wafer, a negative meniscus lens $L_{13}$ which presents a concave surface toward reticle R, and three positive lenses $L_{14}$, $L_{15}$, $L_{16}$. Second optical system $G_2$ comprises a first quarter-wave plate $Q_1$, a negative meniscus lens $L_{21}$ which presents a concave surface toward concave mirror $M_C$, and a concave mirror $M_C$. Negative lens $L_{21}$ is meniscoid with the curvature on the side toward concave mirror $M_C$ being stronger. Third optical system $G_3$ comprises a second quarter-wave plate $Q_2$ and a negative meniscus lens $L_{31}$ which presents a concave surface toward wafer W. Fourth optical system $G_4$ comprises three positive lenses $L_{41}$, $L_{42}$, $L_{43}$, a meniscus lens $L_{44}$ which presents a concave surface toward reticle R, four positive lenses $L_{45}$, $L_{46}$, $L_{47}$, $L_{48}$, a negative meniscus lens $L_{49}$ which presents a concave surface toward wafer W, and a positive lens $L_{50}$.

In system 30, beam splitter BS is formed from a polarizing beam splitter PBS, and the pattern on the reticle R is illuminated by S-polarized light. Moreover, all of the lenses, the polarizing beam splitter PBS, and the quarter-wave plates $Q_1$, $Q_2$ are formed from quartz glass ($SiO_2$).

As mentioned above, the present invention is primarily concerned with a catadioptric reduction projection optical system for use in a scanning-type exposure apparatus. The optical elements in the imaging optical system must be sized large enough to accommodate not only the object-side numerical aperture $NA_1$ but also an object of height H in object plane OP. Also, the required element size increases the closer the element is to aperture stop AS.

The optical elements must also be large enough to accommodate not only the image-side numerical aperture $NA_2$ but also the image height Y in image plane IP, with the required element size decreasing the closer the element is to the image plane.

Now, in a scanned exposure, the entire reticle pattern on reticle R is transferred to wafer W as a result of synchronous scanning the reticle and wafer. Accordingly, a slit-shaped field may be employed. In other words, the shape of the field projected during scanning, the shape of the object field in object plane OP that is being scanned at any given instant, and the shape of the image field in the image plane IP that is being scanned at any given instant, is short in the scan direction (i.e., direction 12 and 14) but long in the cross-scan direction. The cross-scan direction is defined as the direction perpendicular to the scan direction. That is, both object height H and image height Y will be sufficiently small in the scan direction. As mentioned above, it is preferred that the plane of incidence contain the scan direction. Also, the cross-sectional profile of beam splitter BS in a plane parallel to the plane of incidence should be of sufficient size and shape to accommodate the object-side numerical aperture $NA_1$ and the image-side numerical aperture $NA_2$.

In a reduction projection optical system, the object-side numerical aperture $NA_1$ is smaller than the image-side numerical aperture $NA_2$. In the present invention, beam splitter BS is arranged objectwise of aperture stop AS. This arrangement permits beam splitter BS to be small.

Transmissoreflective surface S of beam slitter BS is typically arranged such that it forms a 45° angle with optical axis A. Accordingly, the latter is bent 90° in going to and returning from beam splitter BS. However, it is typically desired that object plane OP and image plane OP be parallel. Reflective plane surface $M_P$ is therefore arranged so as to bend optical axis A by −90° so as to return the axis its original direction.

The present applicant has, in Japanese Patent Application (Tokugan) No. H9[1997]-267941, disclosed a design for a catadioptric reduction projection optical system in which a beam splitter and a concave mirror are arranged objectwise of an aperture stop, and a reflective plane surface is arranged objectwise of the beam splitter and the concave mirror. However, in the present invention, reflective plane surface $M_P$ is arranged to objectwise of aperture stop AS, and beam splitter BS and concave mirror $M_C$ are arranged objectwise of the reflective plane surface. Moreover, the required size for an optical system element grows smaller the farther away toward the first surface the component is from the aperture stop. Thus, the present invention permits the beam splitter and the concave mirror to be made even smaller than the system disclosed in Japanese Patent Application (Tokugan) No. H9[1997]-267941.

It is preferable that the catadioptric reduction projection optical system of the present invention be telecentric at both object plane OP and image plane IP. This allows distortion in the image to be reduced to an amount small enough to be ignored, despite the occurrence of axial deviations of either reticle R or wafer W due to deflection or the like.

It is also preferable that aperture stop AS be arranged within fourth optical system $G_4$. This allows the coherence factor (σ value) to be adjusted uniformly across the entire exposure field (not shown). In addition, it is preferable that aperture stop AS be arranged in the vicinity of the front focus of fourth optical system $G_4$.

It is also preferable the catadioptric reduction projection optical system of the present invention satisfy a number of preferred design conditions.

With reference to FIGS. 1 and 3, the first preferred design condition is given by:

$$0.2 < X_1/X_2 < 1.3 \tag{1}$$

wherein $X_1$ is the distance along optical axis A from the object plane OP to concave mirror $M_C$, and $X_2$ is the distance along optical axis A from concave mirror $M_C$ to image plane IP. Condition (1) is for keeping the system to a practical size, yet allowing for satisfactorily correcting of off-axis aberrations such as distortion and the like, while also allowing beam splitter BS to be small. Above the upper limit of condition (1), it is not possible to attain a sufficiently small beam splitter. Conversely, below the lower limit of condition (1), first optical system $G_1$ tends to become large in size, and degradation of off-axis aberrations becomes unavoidable. It is more preferable still to employ an upper limit of 1.0 and a lower limit of 0.35 in condition (1).

The second preferred design condition is given by:

$$0.1 < S_3/S_4 < 0.8 \tag{2}$$

wherein $S_3$ is the maximum effective area at third optical system $G_3$ of marginal luminous flux emerging from an object point on optical axis A at object plane OP, and $S_4$ is the maximum effective area at fourth optical system $G_4$ of marginal luminous flux emerging from an object point on optical axis A at object plane OP.

Condition (2) allows for a large image-side numerical aperture $NA_2$ and satisfactory correction of the various types of aberration, while still allowing for a sufficiently small beam splitter BS. By satisfying condition (2), it is possible to simultaneously obtain a small beam splitter, as well as resolution on the order of a quarter micron or less. It is even more preferable still to employ an upper limit of 0.5 and a lower limit of 0.15 in condition (2).

With continuing reference to FIGS. 1 and 3, it is also preferable that second optical system $G_2$ of the present invention have, in addition to concave mirror $M_C$, at least one negative lens $L_{21}$ arranged between the concave mirror and beam splitter BS. This makes it possible to ensure a Petzval sum of zero for the entire system. It also makes it possible to satisfactorily correct for curvature of image plane IP (i.e., field curvature).

In conventional catadioptric reduction projection optical systems, the imagewise surface of negative lens $L_{21}$ has the stronger negative refracting power. However, it is preferable in the present invention that the objectwise side of this negative lens have the stronger negative refracting power. This makes it possible to satisfactorily correct coma, astigmatism, and distortion.

The third and fourth preferred design conditions are given by:

$$|\beta/\beta_1| < 0.1 \quad (3)$$

$$|f_1/f_2| < 1.5 \quad (4)$$

wherein $\beta$ is the image (i.e., transverse) magnification of the overall system, $\beta_1$ is the image (i.e., transverse) magnification of first optical system, $G_1$ is the focal length of first optical system $G_2$, and $f_2$ is the focal length of second optical system $G_2$.

Conditions (3) and (4) are for ensuring there is little difference in the angles with which light rays are incident transmissoreflective surface S of beam splitter BS. The conditions also eliminate the production of stray light as a result of flare or the like due to the angular characteristics of the films (not shown) on transmissoreflective surface S. By satisfying conditions (4) and (5), there is little difference in the angles with which light rays are incident transmissoreflective surface S. This makes it possible to improve the performance of the transmissoreflective film(s) thereon, and to prevent occurrence of luminous energy losses and stray light. Considering the fact that the number of materials capable of being used for such film(s) grows fewer as the wavelength used for exposure grows shorter, it is more preferable still to employ an upper limit of 0.05 at condition (3) and an upper limit of 1.0 at condition (4).

To achieve efficient usage of light, a polarizing beam splitter, such as polarizing beam splitter PBS of catadioptric reduction optical system 30 of FIG. 3, may be employed as beam splitter BS. In such a case, quarter-wave plate $Q_1$ should be arranged in reflection optical path 22 objectwise of polarizing beam splitter PBS.

When polarizing beam splitter PBS is employed, the light beam that finally exits the polarizing beam splitter will be linearly polarized. However, there are cases, depending on the directionality of the pattern on the reticle, in which it will be preferable to use circularly polarized light to form the image. In such cases, quarter-wave plate $Q_2$ can be arranged in transmission optical path 24 imagewise of polarizing beam splitter (PBS) so as to convert the linearly polarized light to circularly polarized light.

Because the light beam diameter is sufficiently small in the scan direction, it is possible to use a small quarter-wave plate. Note that quarter-wave plate $Q_2$ arranged in the optical path of the light exiting polarizing beam splitter PBS may also be arranged in the vicinity of image plane IP.

WORKING EXAMPLES

Design specification values pertaining to Working Examples 1 and 2 of the first and second embodiments of the present invention are respectively presented in Tables 1A, 1B and 2A, 2B below. These Working Examples are representative of catadioptric reduction optical systems 10 and 30 of FIGS. 1 and 3, respectively.

In the Tables, under the heading "Design Specification," the first column S lists the number of the optical surface as counted objectwise to imagewise, the second column "r" lists the radius of curvature of the optical surface, the third column "d" lists the distance along the optical axis from that optical surface to the adjacent optical surface, the fourth column "glass type" lists the type of glass present between that optical surface and the next optical surface (or indicates air if this column is left blank), and the fifth column "Element" lists the reference number of the optical member. In determining the sign of the radius of curvature r and the distance d along optical axis A, the direction of propagation of light is taken as the positive direction. This sign is reversed with each reflection. Furthermore, as the type of glass for all of the optical members at the second embodiment is quartz glass ($SiO_2$), the fourth column has been omitted from Table 2A. Refractive indices for quartz glass ($SiO_2$) and fluorite ($CaF_2$) at the wavelength $\lambda$ used ($\lambda = 193.3$ nm) are as follows.

$SiO_2$: n=1.560326

$CaF_2$: n=1.501455

Furthermore, an asterisk (*) in the S column indicates an aspheric surface. In this case, the value indicated in the r column is the radius of curvature at the vertex thereof. Aspheric shape is expressed as:

$$z(y) = \frac{y^2/r}{1 + \sqrt{1-(1+\kappa)y^2/r^2}} + Ay^4 + By^6 + Cy^8 + Dy^{10}$$

y = Height from optical axis z = Distance in direction of optical axis from tangent plane to aspheric surface r = Radius of curvature at vertex $\kappa$ = Conic constant A, B, C, D = Aspheric deformation coefficients The values of the aspheric deformation coefficients A, B, C, D and of the conic constant $\kappa$ are set forth under the heading "Aspheric Data" in Tables 1B and 2B.

Figure 2A:
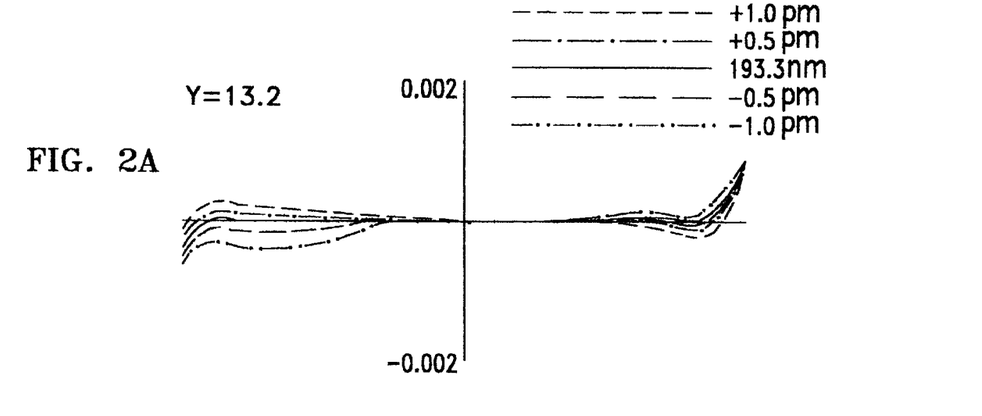
FIG. 2 are lateral aberration curves at various wavelengths around and including 193.3 nm for Working Example 1 representing the first embodiment of FIG. 1.
Figure 2B:
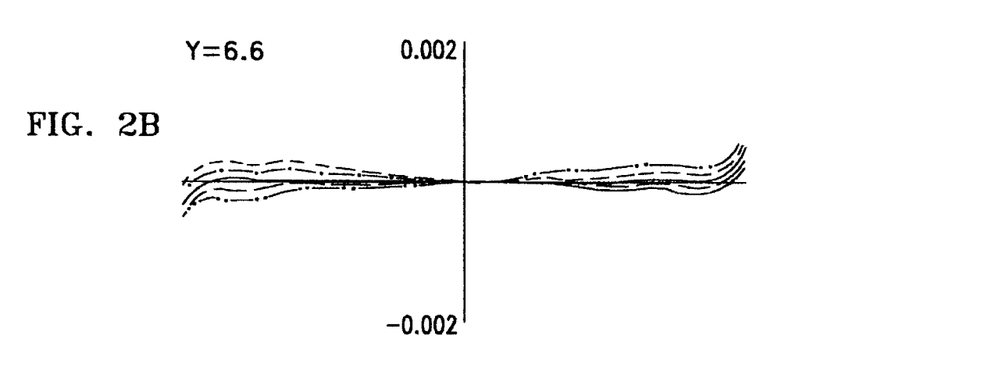
Figure 2C:
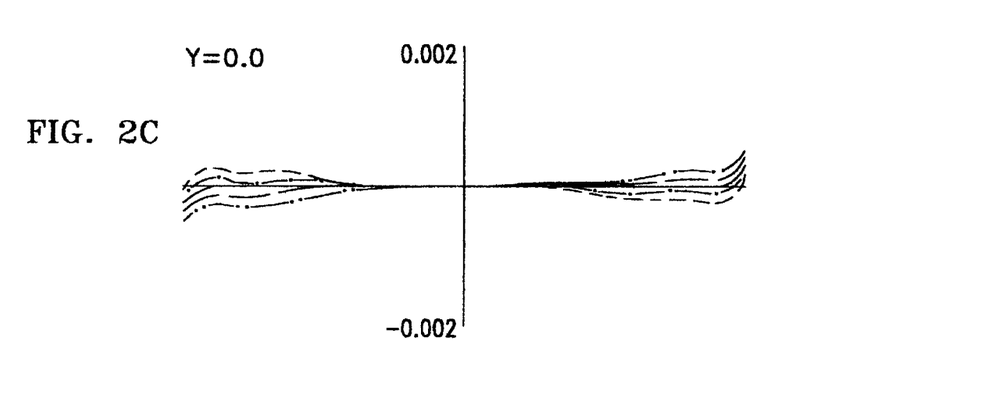
Figure 4A:
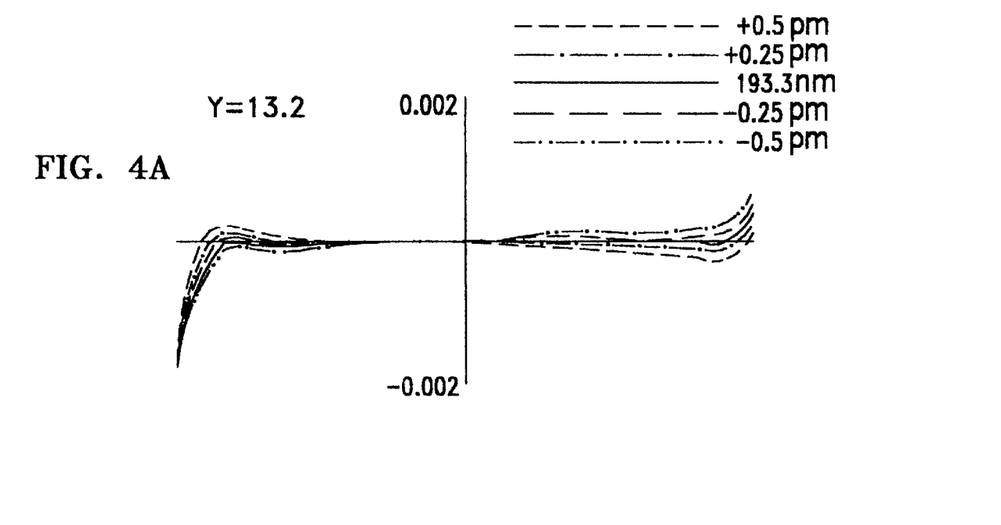
FIG. 4 are lateral aberration curves at various wavelengths around and including 193.3 nm for Working Example 2 representing the second embodiment of FIG. 3.
Figure 4B:
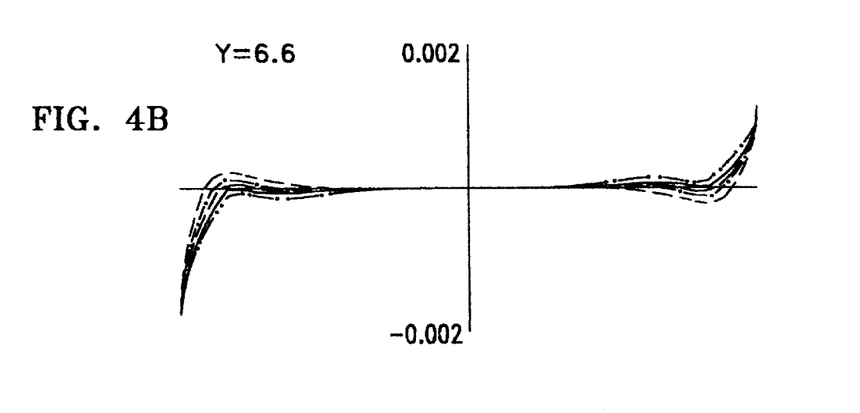
Figure 4C:
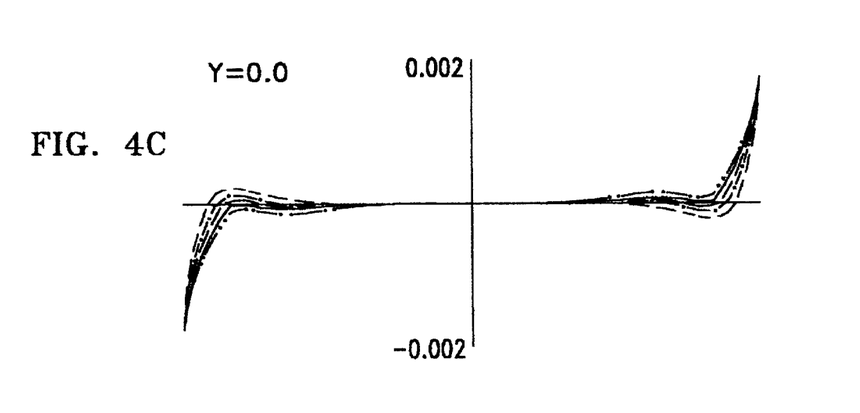

FIGS. 2 and 4 respectively are lateral aberration plots for Working Examples 1 and 2. In the lateral aberration curves, Y indicates image height.

TABLE 1A

DESIGN SPECIFICATIONS FOR WORKING EXAMPLE 1

$NA_2 = 0.65 \quad \beta = 0.25$
Slit Field = 25 mm × 8 mm
Wavelength = 193.3 nm ± 1 PM
Beam Splitter Size = 130 mm × 130 mm × 200 mm
$X_1 = 541.92 \quad X_2 = 771.49 \quad S_3 = 9727.83 \quad S_4 = 27603.54$
$\beta_1 = 8.16 \quad f_1 = 347.87 \quad f_2 = -1767.59$
(1) $X_1/X_2 = 0.7024$
(2) $S_3/S_4 = 0.3524$
(3) $|\beta/\beta_1| = 0.0306$
(4) $f_1/f_2 = 0.1968$

| S  | r         | d      | Glass Type | Element |
|----|-----------|--------|------------|---------|
| 0  | ?         | 57.331 |            | R       |
| 1  | -153.1541 | 23.661 | $SiO_2$    | $L_{11}$ |
| 2  | -230.8002 | 0.500  |            |         |
| 3  | 235.6958  | 15.000 | $SiO_2$    | $L_{12}$ |
| *4 | 210.0000  | 96.454 |            |         |
| 5  | -124.5527 | 15.014 | $SiO_2$    | $L_{13}$ |
| 6  | -223.1037 | 2.735  |            |         |
| 7  | -1189.4584| 29.677 | $SiO_2$    | $L_{14}$ |
| 8  | -231.4485 | 3.773  |            |         |
| 9  | 1693.4491 | 25.538 | $SiO_2$    | $L_{15}$ |
| 10 | -482.0075 | 6.363  |            |         |

TABLE 1A-continued

DESIGN SPECIFICATIONS FOR WORKING EXAMPLE 1

$NA_2 = 0.65$  $\beta = 0.25$
Slit Field = 25 mm × 8 mm
Wavelength = 193.3 nm ± 1 PM
Beam Splitter Size = 130 mm × 130 mm × 200 mm
$X_1 = 541.92$  $X_2 = 771.49$  $S_3 = 9727.83$  $S_4 = 27603.54$
$\beta_1 = 8.16$  $f_1 = 347.87$  $f_2 = -1767.59$
(1) $X_1/X_2 = 0.7024$
(2) $S_3/S_4 = 0.3524$
(3) $|\beta/\beta_1| = 0.0306$
(4) $f_1/f_2 = 0.1968$

| S | r | d | Glass Type | Element |
|---|---|---|---|---|
| 11 | 449.2508 | 24.083 | $SiO_2$ | $L_{16}$ |
| 12 | -5305.8747 | 70.000 | | |
| 13 | ∞ | 65.000 | $SiO_2$ | BS |
| 14 | ∞ | -65.000 | | S (reflection) |
| 15 | ∞ | -6.748 | | |
| 16 | 710.0054 | -15.000 | $SiO_2$ | $L_{21}$ |
| 17 | -371.7333 | -20.039 | | |
| 18 | 516.7041 | 20.039 | | $M_c$ |
| 19 | -371.7333 | 15.000 | $SiO_2$ | $L_{21}$ |
| 20 | 710.0054 | 6.748 | | |
| 21 | ∞ | 65.000 | $SiO_2$ | BS |
| 22 | ∞ | 65.000 | $SiO_2$ | S (transmission) |
| 23 | ∞ | 0.500 | | |
| 24 | 332.3467 | 15.306 | $SiO_2$ | $L_{31}$ |
| 25 | 168.1156 | 130.000 | | |
| 26 | ∞ | -100.000 | | $M_P$ |
| *27 | -443.0711 | -23.168 | $SiO_2$ | $L_{41}$ |
| 28 | 733.1198 | -10.000 | | |
| 29 | — | -10.000 | | AS |
| 30 | -286.7891 | -25.014 | $CaF_2$ | $L_{42}$ |
| 31 | 7561.5538 | -10.137 | | |
| 32 | 492.8999 | -25.000 | $SiO_2$ | $L_{43}$ |
| 33 | 1269.2772 | -58.855 | | |
| 34 | -1033.9777 | -25.000 | $SiO_2$ | $L_{44}$ |
| 35 | 432.9074 | -0.500 | | |
| 36 | -229.5620 | -26.638 | $SiO_2$ | $L_{45}$ |
| 37 | 2047.5408 | -0.500 | | |
| 38 | -127.6925 | -24.732 | $CaF_2$ | $L_{46}$ |
| 39 | -419.1295 | -9.601 | | |
| 40 | 833.6161 | -36.247 | $SiO_2$ | $L_{47}$ |
| 41 | 973.7202 | -0.500 | | |
| 42 | -1242.0973 | -56.000 | $SiO_2$ | $L_{48}$ |
| 43 | 23719.9498 | -12.000 | | |
| 44 | ∞ | | | W |

TABLE 1B

ASPHERIC DATA FOR WORKING EXAMPLE 1

S4  $\kappa = 0.0$  $A = -0.321495 \times 10^{-7}$
$B = 0.973748 \times 10^{-12}$  $C = -0.486853 \times 10^{-16}$  $D = 0.134711 \times 10^{-20}$
S27  $\kappa = 0.0$  $A = 0.139028 \times 10^{-7}$
$B = 0.139351 \times 10^{-12}$  $C = 0.209333 \times 10^{-17}$  $D = 0.165121 \times 10^{-21}$

TABLE 2A

DESIGN SPECIFICATIONS FOR WORKING EXAMPLE 2

$NA_1 = 0.80$  $\beta = 0.25$
Slit Field = 25 mm × 8 mm
Wavelength = 193.3 nm ± 0.5 PM
Beam Splitter Size = 180 mm × 180 mm × 270 mm
$X_1 = 648.38$  $X_2 = 1016.28$  $S_3 = 17676.63$  $S_4 = 71856.10$
$\beta_1 = 7.43$  $f_1 = 421.01$  $f_2 = -18583.51$
(1) $X_1/X_2 = 0.6380$
(2) $S_3/S_4 = 0.2460$
(3) $|\beta/\beta_1| = 0.0336$
(4) $f_1/f_2 = 0.0227$

| S | r | d | Element |
|---|---|---|---|
| 0 | ∞ | 45.779 | R |
| 1 | -334.1305 | 48.066 | $L_{11}$ |
| 2 | 725.6366 | 50.024 | |
| 3 | 418.3870 | 38.810 | $L_{12}$ |
| 4 | 1086.6168 | 44.046 | |
| 5 | -150.8403 | 27.176 | $L_{13}$ |
| 6 | -230.4165 | 1.505 | |
| 7 | -928.0353 | 29.029 | $L_{14}$ |
| 8 | -315.2488 | 1.088 | |
| 9 | -7635.0848 | 30.350 | $L_{15}$ |
| 10 | -464.3986 | 0.500 | |
| 11 | 1401.6433 | 32.180 | $L_{16}$ |
| 12 | -643.1938 | 70.652 | |
| 13 | ∞ | 85.000 | PBS |
| 14 | ∞ | -85.000 | S (reflection) |
| 15 | ∞ | -1.000 | |
| 16 | ∞ | -8.000 | $Q_1$ |
| 17 | ∞ | -0.500 | |
| 18 | -4072.6632 | -20.000 | $L_{21}$ |
| *19 | -346.9845 | -29.749 | $M_c$ |
| 20 | 694.6245 | 29.749 | |
| *21 | -346.9845 | 20.000 | $L_{21}$ |
| 22 | -4072.6632 | 0.500 | |
| 23 | ∞ | 8.000 | $Q_1$ |
| 24 | ∞ | 1.000 | |
| 25 | ∞ | 85.000 | PBS |
| 26 | ∞ | 85.000 | S (transmission) |
| 27 | ∞ | 1.000 | |
| 28 | ∞ | 8.000 | $Q_2$ |
| 29 | ∞ | 0.500 | |
| 30 | 1777.8289 | 20.015 | $L_{31}$ |
| 31 | 227.6422 | 180.000 | |
| 32 | ∞ | -140.000 | $M_P$ |
| *33 | -512.9805 | -36.668 | $L_{41}$ |
| 34 | 1543.4659 | -5.000 | |
| 35 | — | -8.025 | AS |
| 36 | -438.3116 | -44.882 | $L_{42}$ |
| 37 | -8385.5474 | -12.948 | |
| 38 | -336.3081 | -35.261 | $L_{43}$ |
| 39 | -1238.6529 | -54.431 | |
| 40 | 315.8425 | -28.000 | $L_{44}$ |
| 41 | 430.0000 | -0.500 | |
| 42 | ∞ | -25.770 | $L_{45}$ |
| 43 | 585.7079 | -0.500 | |
| 44 | -942.8948 | -30.000 | $L_{46}$ |
| 45 | 2032.4766 | -0.500 | |
| 46 | -201.2200 | -25.729 | $L_{47}$ |
| 47 | -367.1800 | -1.000 | |
| 48 | -127.6266 | -30.529 | $L_{48}$ |
| 49 | -253.4279 | -14.686 | |
| 50 | -696.3401 | -15.000 | $L_{49}$ |
| 51 | -86.3431 | -3.483 | |
| 52 | -92.4548 | -53.000 | $L_{50}$ |
| 53 | -4239.8801 | -11.600 | |
| 54 | ∞ | | W |

TABLE 2B

ASPHERIC DATA FOR WORKING EXAMPLE 2

S19, S21  $\kappa = 1.14032$  $A = 0.640687 \times 10^{-8}$
$B = 0.132104 \times 10^{-13}$  $C = 0.353193 \times 10^{-18}$  $D = -0.556927 \times 10^{-23}$ TABLE 2B-continued

ASPHERIC DATA FOR WORKING EXAMPLE 2

S33     κ = 2.69288           A = 0.384944 × $10^{-8}$
B = 0.108895 × $10^{-13}$     C = 0.114774 × $10^{-20}$     D = −0.305554 × $10^{-23}$

As is clear from the aberration plots in FIGS. 2 and 4, the imaging performance of both Working Examples 1 and 2 is excellent.

Figure 5:
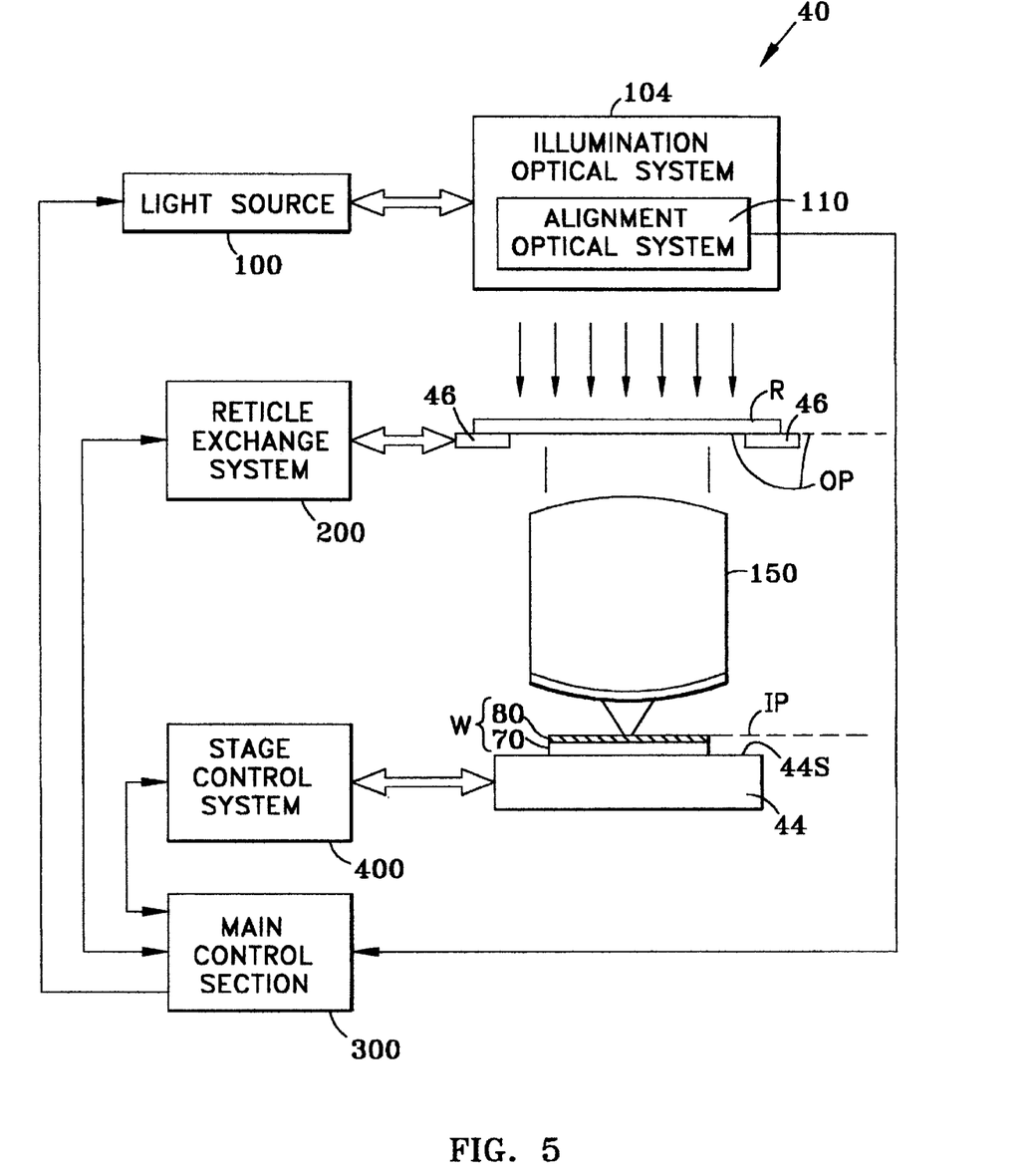
FIG. 5 is a schematic diagram of a one-shot exposure apparatus to which the catadioptric reduction projection optical system of the present invention is applicable.

With reference now to FIG. 5, exposure apparatus 40 of the present invention comprises a wafer stage 44 (i.e., a first stage) which is a moveable stage in which photosensitive substrate W can be held on a surface 44S thereof; a reticle stage 46 (i.e., a second stage) which is a movable stage for holding reticle R; a light source 100 for emitting exposure light having a predetermined wavelength; and an illumination optical system 104 for illuminating the reticle R with the exposure light from light source 100 so as to transfer an image of a predetermined pattern (not shown) of an electronic circuit or the like present on reticle R to photosensitive substrate W. Here, photosensitive substrate W comprises, for example, an exposure member 70 such as a silicon wafer or glass plate whose surface is coated with a photosensitive material 80 such as photoresist. Also, illumination optical system 104 includes an alignment optical system 110 for positioning reticle R and photosensitive substrate W with respect to each other.

Exposure apparatus 40 further includes a reticle exchange system 200 which exchanges reticle R to be held on reticle stage 46 and moves the latter according to instructions from a main control section 300 and a stage control system 400 for moving wafer stage 44 according to instructions from the main control section. For example, when main control section 300 obtains amounts of deviation of stages 44 and 46 from alignment optical system 110, it calculates amounts of movement of the stages and the output instructions for movement thereto. Stages 44 and 46 move in their respective predetermined directions so as to adjust the positions of reticle R and photosensitive substrate W with respect to each other.

Exposure apparatus 40 also includes a catadioptric reduction projection optical system 150, in accordance with the present invention (e.g., system 10 of FIG. 1 or system 30 of FIG. 3). System 150 is arranged between reticle stage 46 and wafer stage 44, namely, between object plane OP and image plane IP, so as to project upon substrate W a reduced image of the predetermined pattern on reticle R.

The present invention provides a catadioptric reduction optical system that is capable of being used as a projection optical system in a scanning-type exposure apparatus. The present invention also allows for large numerical apertures at ultraviolet wavelengths. Further, the sizes of the concave mirror and the prismatic beam splitter lend themselves to practical use. An adequate working distance at the image side is ensured, and the resolution is on the order of a quarter micron.

While the present invention has been described in connection with preferred embodiments, it will be understood that it is not so limited. On the contrary, it is intended to cover all alternatives, modifications and equivalents as may be included within the spirit and scope of the invention as defined in the appended claims.

What is claimed is:

1. A catadioptric reduction projection optical system that forms a reduced image of a pattern of a first surface on a second surface by scanning the first and second surfaces in a scanning direction, comprising, in order from the first surface to the second surface along a folded optical axis defining a plane of incidence:

a) a first optical system having positive refracting power;

b) a beam splitter having a transmissoreflective surface, a reflection optical path and a transmission optical path, said beam splitter arranged such that the plane of incidence includes the scanning direction;

c) a second optical system comprising a single concave mirror and arranged in one of said reflection optical path and said transmission optical path;

d) a third optical system having negative refracting power and including a reflective plane surface, said third optical system arranged in the opposite one of said reflection optical path and said transmission optical path as said second optical system;

e) a fourth optical system having positive refracting power, an aperture stop within said fourth optical system, and
   wherein the catadioptric reduction optical system is first-surface-side telecentric and second-surface-side telecentric.

2. A catadioptric reduction projection optical system according to claim 1, wherein $X_1$ is a distance along the optical axis from the first surface to said concave mirror, $X_2$ is a distance along the optical axis from said concave mirror to the second surface, and wherein the following condition is satisfied:

$$0.2 < X_1/X_2 < 1.3 \qquad (1).$$

3. A catadioptric reduction projection optical system according to claim 2, wherein the first and second surfaces are parallel.

4. A catadioptric reduction projection optical system according to claim 2, wherein $S_3$ is a maximum effective area at said third optical system of marginal luminous flux emerging from an object point on the optical axis at the first surface, $S_4$ is a maximum effective area at said fourth optical system of marginal luminous flux emerging from an object point on the optical axis at the aforesaid first surface, and wherein the following condition is satisfied:

$$0.1 < S_3/S_4 < 0.8 \qquad (2).$$

5. A catadioptric reduction projection optical system according to claim 4, wherein:

a) β is an overall transverse magnification, $β_1$ is a transverse magnification of said first optical system, $f_1$ is a focal length of said first optical system, and $f_2$ is a focal length of said second optical system;

b) said second optical system comprises at least one negative lens; and c) the following conditions are satisfied:

$$|β/β_1| < 0.1 \qquad (3)$$

$$|f_1/f_2| < 1.5 \qquad (4).$$

6. A catadioptric reduction projection optical system according to claim 2, wherein:

a) β is an overall transverse magnification, $β_1$ is a transverse magnification of said first optical system, $f_1$ is a focal length of said first optical system, and $f_2$ is a focal length of said second optical system;

b) said second optical system comprises at least one negative lens; and c) the following conditions are satisfied:

$$|\beta/\beta_1|<0.1 \quad (3)$$

$$|f_1/f_2|<1.5 \quad (4).$$

7. A catadioptric reduction projection optical system according to claim 1, wherein the first and second surfaces are parallel.

8. A catadioptric reduction projection optical system according to claim 1, wherein $S_3$ is a maximum effective area at said third optical system of marginal luminous flux emerging from an object point on the optical axis at the first surface, $S_4$ is a maximum effective area at said fourth optical system of marginal luminous flux emerging from an object point on the optical axis at the aforesaid first surface, and wherein the following condition is satisfied:

$$0.1<S_3/S_4<0.8 \quad (2).$$

9. A catadioptric reduction projection optical system according to claim 1, wherein:
   a) $\beta$ is an overall transverse magnification, $\beta_1$ is a transverse magnification of said first optical system, $f_1$ is a focal length of said first optical system, and $f_2$ is a focal length of said second optical system;
   b) said second optical system comprises at least one negative lens; and
   c) the following conditions are satisfied:

$$|\beta/\beta_1|<0.1 \quad (3)$$

$$|f_1/f_2|<1.5 \quad (4).$$

10. An exposure apparatus comprising:
    a) an illumination optical system;
    b) a reticle stage arranged adjacent said illumination optical system, for holding a reticle;
    c) a catadioptric reduction projection optical system according to claim 1, arranged adjacent said reticle stage and opposite said illumination optical system; and
    d) a wafer stage arranged adjacent said catadioptric reduction projection optical system and opposite said reticle stage, for holding a wafer.

11. A method of exposing a photosensitive substrate with a pattern present on a reticle, comprising the steps of:
    a) illuminating a portion of the pattern present on the reticle;
    b) projecting light from the reticle through a catadioptric reduction projection optical system according to claim 1; and
    c) synchronously scanning the reticle and the wafer and forming an image of substantially the entire pattern on the photosensitive substrate.

12. A catadioptric reduction projection optical system that forms a reduced image of a pattern of a first surface on a second surface by scanning the first and second surfaces in a scanning direction, comprising, in order from the first surface to the second surface along a folded optical axis defining a plane of incidence:
    a) a first optical system having positive refracting power;
    b) a beam splitter having a transmissoreflective surface, a reflection optical path and a transmission optical path, said beam splitter arranged such that the plane of incidence includes the scanning direction;
    c) a second optical system comprising a single concave mirror and arranged in one of said reflection optical path and said transmission optical path;
    d) a third optical system having negative refracting power and including a reflective plane surface, said third optical system arranged in the opposite one of said reflection optical path and said transmission optical path as said second optical system; and
    e) a fourth optical system having positive refracting power,
       wherein $S_3$ is a maximum effective area at said third optical system of marginal luminous flux emerging from an object point on the optical axis at the first surface, $S_4$ is a maximum effective area at said fourth optical system of marginal luminous flux emerging from an object point on the optical axis at the first surface, and wherein the following condition is satisfied:

$$0.1<S_3/S_4<0.8 \quad (2).$$

13. A catadioptric reduction projection optical system that forms a reduced image of a pattern of a first surface on a second surface by scanning the first and second surfaces in a scanning direction, comprising, in order from the first surface to the second surface along a folded optical axis defining a plane of incidence:
    a) a first optical system having positive refracting power;
    b) a beam splitter having a transmissoreflective surface, a reflection optical path and a transmission optical path, said beam splitter arranged such that the plane of incidence includes the scanning direction;
    c) a second optical system comprising a single concave mirror and arranged in one of said reflection optical path and said transmission optical path;
    d) a third optical system having negative refracting power and including a reflective plane surface, said third optical system arranged in the opposite one of said reflection optical path and said transmission optical path as said second optical system; and
    e) a fourth optical system having positive refracting power,
       wherein:
       i) $\beta$ is an overall transverse magnification, $\beta_1$ is a transverse magnification of said first optical system, $f_1$ is a focal length of said first optical system, and $f_2$ is a focal length of said second optical system;
       ii) said second optical system comprises at least one negative lens; and
       iii) the following conditions are satisfied:

$$|\beta/\beta_1|<0.1 \quad (3)$$

$$|f_1/f_2|<1.5 \quad (4).$$

14. A catadioptric reduction projection optical system that forms a reduced image of a pattern of a first surface on a second surface by scanning the first and second surfaces in a scanning direction, comprising, in order from the first surface to the second surface along a folded optical axis defining a plane of incidence:
    a) a first optical system having positive refracting power;
    b) a beam splitter having a transmissoreflective surface, a reflection optical path and a transmission optical path, said beam splitter arranged such that the plane of incidence includes the scanning direction;
    c) a second optical system comprising a single concave mirror and arranged in one of said reflection optical path and said transmission optical path;

d) a third optical system having negative refracting power and including a reflective plane surface, said third optical system arranged in the opposite one of said reflection optical path and said transmission optical path as said second optical system; and e) a fourth optical system having positive refracting power;

wherein $X_1$ is a distance along the optical axis from the first surface to said concave mirror, $X_2$ is a distance along the optical axis from said concave mirror to the second surface, and where the following condition is satisfied:

$$0.2 < X_1/X_2 < 1.3 \qquad (1).$$

15. A catadioptric reduction projection optical system according to claim 14, wherein the first and second surfaces are parallel.

16. A catadioptric reduction projection optical system according to claim 14, wherein $S_3$ is a maximum effective area at said third optical system of marginal luminous flux emerging from an object point on the optical axis at the first surface, $S_4$ is a maximum effective area at said fourth optical system of marginal luminous flux emerging from an object point on the optical axis at the aforesaid first surface, and wherein the following condition is satisfied:

$$0.1 < S_3/S_4 < 0.8 \qquad (2).$$

17. A catadioptric reduction projection optical system according to claim 16, wherein:

a) $\beta$ is an overall transverse magnification, $\beta_1$ is a transverse magnification of said first optical system, $f_1$ is a focal length of said first optical system, and $f_2$ is a focal length of said second optical system;

b) said second optical system comprises at least one negative lens; and c) the following conditions are satisfied:

$$|\beta/\beta_1| < 0.1 \qquad (3)$$

$$|f_1/f_2| < 1.5 \qquad (4).$$

18. A catadioptric reduction projection optical system according to claim 14, wherein:

a) $\beta$ is an overall transverse magnification, $\beta_1$ is a transverse magnification of said first optical system, $f_1$ is a focal length of said first optical system, and $f_2$ is a focal length of said second optical system;

b) said second optical system comprises at least one negative lens; and c) the following conditions are satisfied:

$$|\beta/\beta_1| < 0.1 \qquad (3)$$

$$|f_1/f_2| < 1.5 \qquad (4).$$

* * * * *